(12) United States Patent
Wang

(10) Patent No.: US 7,839,192 B1
(45) Date of Patent: Nov. 23, 2010

(54) DUTY CYCLE CORRECTION METHODS AND CIRCUITS

(75) Inventor: Shoujun Wang, Kanata (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/259,919

(22) Filed: Oct. 26, 2005

(51) Int. Cl.
*H03K 3/017* (2006.01)

(52) U.S. Cl. .................................. 327/175; 327/291

(58) Field of Classification Search .............. 327/175, 327/291, 292, 298, 263, 264, 270, 272, 276, 327/281, 112, 389, 391, 170, 172, 173, 174, 327/217; 326/27, 34, 83
See application file for complete search history.

(56) References Cited

U.S. PATENT DOCUMENTS

| | | | | |
|---|---|---|---|---|
| 5,019,724 A * | 5/1991 | McClure | ...................... | 326/29 |
| 6,218,879 B1 * | 4/2001 | Kilpatrick | ................... | 327/217 |
| 6,933,759 B1 * | 8/2005 | Wu et al. | ..................... | 327/172 |
| 7,005,904 B2 * | 2/2006 | Minzoni | ...................... | 327/175 |

OTHER PUBLICATIONS

Numata, K., et al: "Ultra low power consumption heterojunction FET 8:1 MUX/1:8 DEMUX for 2.4 Gbps optical fiber communication systems", Technical Digest, 17th Annual IEEE Gallium Arsenide Integrated Circuit (GaAs IC) Symposium, pp. 39-42, Nov. 1995.
B. W. Garlepp and K.S. Donnelly, "A Portable Digital DLL for High-Speed CMOS Interface Circuits" IEEE J. Solid-State Circuits, vol. 34, No. 5, pp. 632-644, May 1999.
J. Lee and B. Kim, "A Low-Noise Fast-Lock Phase-Locked Loop with Adaptive Bandwidth Control," IEEE J. Solid-State Circuits, vol. 35, No. 8, pp. 1137-1145, Aug. 2000.
J. Zhou and H. Chen, "A 1GHz 1.8V Monolithic CMOS PLL with Improved Locking," Proceedings of the 44th IEEE 2001 Midwest Symposium on Circuits and Systems, vol. 1, pp. 458-461, Aug. 2001.
T. Ogawa and K. Taniguchi, "A 50% Duty-Cycle Correction Circuit for PLL Output," IEEE International symposium on Circuits and Systems, vol. 4, pp. IV21-IV24, May 2002.
C. Jeong, C. Yoo, J. Lee and J Kih "Digital delay locked loop with open-loop digital duty cycle corrector for 1.2Gb/s/pin double data rate SDRAM," Proceeding of the 30th European Solid-State Circuits Conference, pp. 379-382, Sep. 2004.
Y. Wang and J. Wang, "An All-Digital 50% Duty-Cycle Corrector," Proceedings of the 2004 International Symposium on Circuits and Systems, vol. 2, p. II☐925-8, May 2004.
R. Yang and S. Liu, "A Wide-Range Multiphase Delay-Locked Loop Using Mixed-Mode VCDLs" IEICE Trans. Electron., vol. E88-C, No. 6, pp. 1248-1252, Jun. 2005.

* cited by examiner

*Primary Examiner*—Lincoln Donovan
*Assistant Examiner*—Diana J Cheng
(74) *Attorney, Agent, or Firm*—Ropes & Gray LLP; Jeffrey H. Ingerman

(57) ABSTRACT

Duty cycle correction (DCC) methods and circuits are provided for improving the quality of clock signals and reducing or eliminating duty cycle distortion. The performance of known duty cycle correction circuits, such as cross-coupled inverter or transmission gate DCC circuits, may be improved by coupling two or more DCC circuits in series to form a multi-stage DCC circuit. In multi-stage DCC circuits, the performance and sizing requirements imposed on the individual circuit stages are reduced as compared to single-stage DCC circuit implementations. Good duty cycle correction performance over a wide range of input signal duty cycles may therefore be ensured regardless of the performance of individual stages. Clocked-CMOS DCC circuits are also presented, the circuits operative to produce duty cycle corrected output signals while consuming minimal current and power. The clocked-CMOS DCC circuits include as few as four transistors, and are operative over wide ranges of input signal duty cycles.

11 Claims, 6 Drawing Sheets

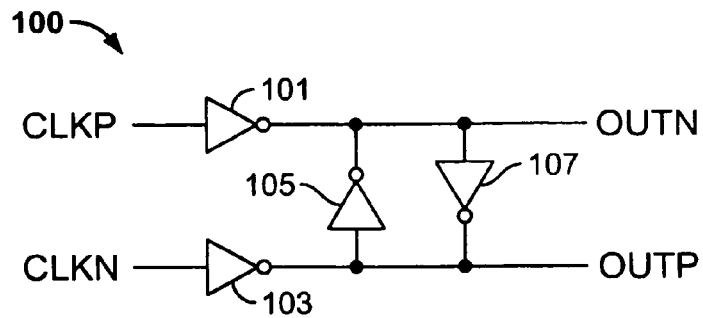
FIG. 1
(PRIOR ART)
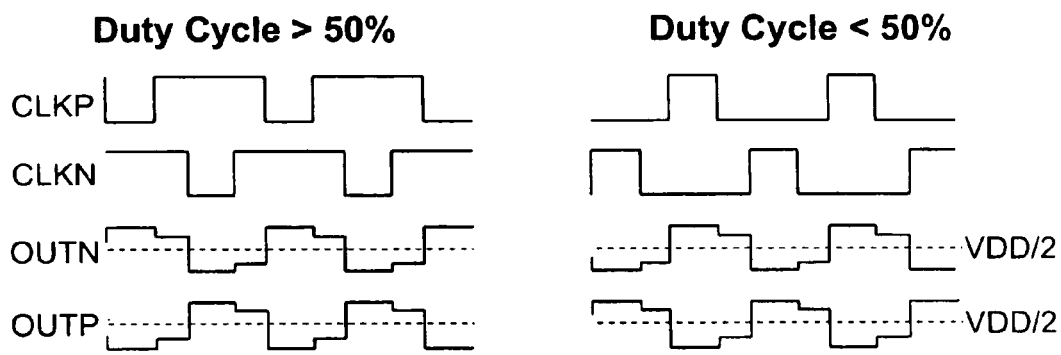
FIG. 2A
(PRIOR ART)
FIG. 2B
(PRIOR ART)
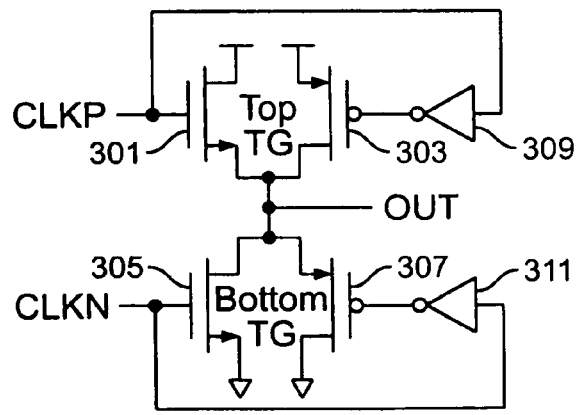
FIG. 3
(PRIOR ART)

DUTY CYCLE CORRECTION METHODS AND CIRCUITS

BACKGROUND OF THE INVENTION

This invention relates to duty cycle correction (DCC) methods and circuitry. Feed-forward duty cycle correction methods and circuits are used to recover or improve the quality of clock signals. Such methods and circuitry may be used at any stage in the clock path to improve the quality of the clock signal.

The duty cycle of a clock signal is the ratio of the pulse duration to the pulse period. A clock signal with 50% duty cycle is therefore in a HIGH logic state for half of the signal period, and in a LOW logic state for the other half of the signal period. Signals that are HIGH for more than half of the signal period have duty cycles above 50%, while signals that are LOW for more than half of the signal period have duty cycles below 50%.

High-speed circuits that use both the rising and falling edges of the clock signal for timing require clock signals that have 50% duty cycle. Circuits that rely on both clock edges include double-data rate (DDR) SDRAM circuits and half-rate clock and data recovery (CDR) circuits, for example. If the duty cycle of the clock signal in these circuits is not equal to 50%, the circuits may function improperly due to timing errors. Maintaining a 50% clock duty cycle in these circuits is therefore extremely important. Duty cycle correction circuits are commonly used to correct and adjust the duty cycle of clock signals in these high-speed circuits, to improve the quality of the clock signal and to ensure that a 50% duty cycle is maintained.

Two types of duty cycle correction circuits are commonly used, notably feedforward and feedback DCC circuits. The feedback DCC circuits typically have less jitter, better performance, and are less sensitive to noise than the feedforward types. However, they require more complicated circuitry and may introduce stability problems in the circuit. Feedforward DCC circuits can reduce the hardware complexity of the DCC circuitry, eliminate the feedback stability problems, and eliminate the training periods required by feedback correctors.

The performance of duty cycle correction methods and circuits may be measured in terms of the range of input signal duty cycles for which the circuit will function properly, in terms of how accurate or close to 50% the duty cycle of the output signal is, and in terms of the total current or power consumption of the duty cycle correction circuit. The present invention provides improved feed-forward duty cycle correction methods and circuits which function accurately with wide ranges of input signal duty cycles. In addition, the circuits presented function with reduced power consumption.

SUMMARY OF THE INVENTION

The invention provides methods and circuits for recovering or correcting the duty cycle of clock signals. In particular, the invention provides feed-forward duty cycle correction (DCC) methods and circuits.

Clocked CMOS DCC circuits are operative to correct the duty cycle of signals over a wide range of input signal duty cycles. The clocked CMOS DCC circuits include as few as four transistors for single-ended operation, and as few as eight transistors for producing a fully differential output signal. The circuits consume limited amounts of current by eliminating the short-circuit currents which typically flow through other known DCC circuits.

Multi-stage DCC circuits make use of known DCC circuits coupled in series for their operation. Individual stages may include cross-coupled inverter DCC or transmission gate DCC circuits, for example. The multi-stage DCC circuits provide accurate duty cycle correction over wider ranges of input duty cycles, as compared to their single stage counterparts. In addition, the sizing and performance requirements of the individual stages are greatly reduced, ensuring that the multi-stage DCC circuits function properly despite fabrication or other variations in the circuits.

Further features of the invention, its nature and various advantages, will be more apparent from the accompanying drawings and the following detailed description.

BRIEF DESCRIPTION OF THE DRAWINGS

FIG. 1 shows a schematic diagram of a cross-coupled inverter DCC circuit of the prior art.

FIGS. 2A and 2B show timing diagrams of cross-coupled inverter DCC circuits of the prior art.

FIG. 3 shows a schematic circuit diagram of a transmission-gate DCC circuit of the prior art.

DETAILED DESCRIPTION

Figure 4A:
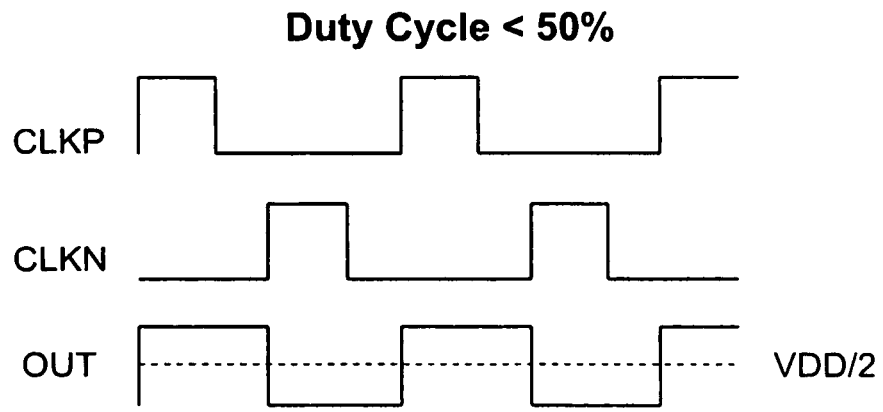
FIGS. 4A and 4B show timing diagrams of transmission-gate DCC circuits of the prior art.

Duty cycle correction (DCC) circuitry may be used to correct the duty cycle of clock signals at any location in an integrated circuit. DCC circuitry may be especially effective in correcting the duty cycle of clock signals and improving circuit operation when located near high-speed circuit components that require precise timing and synchronization information. DCC circuitry may also be effective to improve the quality of clock signals which have traveled along long wires, traces, I/O pins, or other interconnection conductors, through clock processing circuitry, I/O circuitry, or other types of circuitry, or clock signals which may have suffered from deterioration, skew, or distortion.

The DCC circuitry and the circuitry controlled by the corrected clock may be implemented on one or more integrated circuits, on programmable logic devices, or in other types of circuitry. The corrected clock signal may be used to control the operation of one or more processors, digital signal processors, memory or communications circuitry, as well as other types of circuitry. The DCC circuitry may also be used to process clock signals produced by clock generation circuits, by clock recovery circuits such as those used in asynchronous I/O circuitry, and by other circuits.

The DCC circuits shown and described in this specification require complementary clock signals for their operation. The complementary clock is composed of two identical clock signals delayed by 180 degrees. In circuits in which complementary clock signals are not readily available, a complementary clock signal may be generated from a single-phase clock signal by delaying the clock signal by one half-period.

FIG. 1 shows a schematic diagram of a commonly used cross-coupled inverter Duty Cycle Correction circuit. The cross-coupled inverter DCC circuit 100 has two input nodes CLKP and CLKN, operative to receive complementary clock input signals. Circuit 100 is operative to produce complementary duty cycle corrected clock signals at its two output nodes OUTN and OUTP.

The cross-coupled inverter DCC circuit is formed by two input inverters 101 and 103, input inverter 101 being coupled between input node CLKP and output node OUTN and input inverter 103 being coupled between input node CLKN and output node OUTP. Two additional cross-coupled inverters 105 and 107 complete the circuit. Cross-coupled inverter 105 has its input coupled to node OUTP and its output to node OUTN, and cross-coupled inverter 107 has its input coupled to OUTN and output coupled to OUTP.

Cross-coupled inverters 105 and 107 are operative to ensure the output signals at output leads OUTP and OUTN are complementary. In order to ensure that the signals at leads OUTP and OUTN remain complementary at all times, cross-coupled inverters 105 and 107 generally have stronger driving strengths than input inverters 101 and 103. The stronger driving strength allows the cross-coupled inverters to maintain complementary output signals even when the input inverters attempt to drive the same signal at both of the output leads. In addition, the cross-coupled inverters function in a manner similar to the cross-coupled inverters commonly used in SRAM memory cells. In this manner, the cross-coupled inverters tend to hold the output signals in their current state. The state of the cross-coupled inverters will change only when the input inverters drive complementary signals opposite in sign to the current state at output nodes OUTP and OUTN.

Under operating conditions in which input signals CLKP and CLKN are strictly complementary, the cross-coupled inverter DCC circuit 100 maintains the output signals at output nodes OUTP and OUTN in one of two states—either a logic HIGH or logic LOW. The circuitry ensures that when CLKP is HIGH and CLKN is LOW, OUTP is HIGH and OUTN is LOW. Conversely, when CLKP is LOW and CLKN is HIGH, OUTP is LOW and OUTN is HIGH.

In addition to assuming logic LOW and logic HIGH values, the outputs assume intermediate values when input signals CLKP and CLKN are not complementary. In conditions in which CLKP and CLKN have a duty cycle other than 50%, for example, signals CLKP and CLKN have the same value for at least part of the clock cycle. When CLKP and CLKN have the same value, a logic HIGH for example, input inverters 101 and 103 will act to bring output signals OUTP and OUTN to the same logic LOW value. However, as explained previously, the cross-coupled inverters 105 and 107 act to maintain complementary signals at the output nodes. In these conditions, because the input inverters and cross-coupled inverters are acting against each other, the outputs may settle to an intermediate voltage value between a logic HIGH and a logic LOW. The intermediate voltage values at which the outputs will settle depend on the ratio of driving strength of the cross-coupled and input inverters. In conditions in which the ratio is near one, for example, the outputs may settle at a value near half of the power supply voltage.

FIGS. 2A and 2B show timing diagrams of a cross-coupled inverter DCC circuit such as circuit 100. The timing diagram of FIG. 2A shows the signals at the outputs OUTP and OUTN of circuit 100 in response to an input signal with a duty cycle greater than fifty percent (Duty cycle >50%). The timing diagram of FIG. 2B shows output signal traces produced in response to an input signal with a duty cycle of less than fifty percent (Duty cycle <50%).

The diagrams of FIGS. 2A and 2B show that when CLKP and CLKN signals are complementary, output signals OUTP and OUTN take on complementary logic HIGH and logic LOW values. However, when CLKP and CLKN are equal, output signals OUTP and OUTN take on complementary intermediate values between logic HIGH and logic LOW. These intermediate values are determined by the ratio in driving strength of the cross-coupled and input inverters. By increasing the driving strength of the cross-coupled inverters relative to that of the input inverters, the intermediate voltage values tend to be closer to logic HIGH and logic LOW values.

The ratio in driving strengths is generally selected to be large enough to ensure that the intermediate values are clearly identifiable as either logic HIGHs or logic LOWs, and do not cause erroneous switching between logic states at the outputs of the cross-coupled DCC circuit. In addition, the ratio is selected to be high enough to ensure that the cross-coupled inverters maintain the output signals in their previous state unless both input inverters drive the output signals to their complementary states. The ratio in driving strengths must also be sufficiently low to ensure that when complementary input signals are applied to input nodes CLKP and CLKN, the output signals switch to the appropriate output state.

The diagrams of FIGS. 2A and 2B show that the cross-coupled inverter DCC can produce an output signal with 50% duty cycle when the input signal has a duty cycle above or below 50%. However, the proper operation of the cross-coupled DCC circuit requires that the ratio in driving strength of the input and cross-coupled inverters be within a specific range. If the ratio in driving strength exceeds the range, the input inverters may not be powerful enough to force the output inverters to switch states twice during the cycle. Conversely, if the ratio in driving strength is too low, the intermediate voltage values at the output of the DCC circuit will tend towards half of the supply voltage. This may cause them to be erroneously identified as their complementary value, and may cause the output of the DCC circuit to erroneously switch between states. The performance of the cross-coupled DCC circuit may therefore be limited by the ability to precisely control the driving strength of the inverters. Variations in inverter properties may be caused by variations in integrated circuit fabrication procedures, for example, and may be difficult to control.

FIG. 3 shows a transmission gate DCC circuit diagram. The transmission gate DCC circuit 300 receives complementary input clock signals at its input nodes CLKP and CLKN, and produces a single-ended output clock signal at its output node OUT. Each input node controls a transmission gate, the transmission gates being operative to selectively couple the output node OUT to either the power supply or ground. The upper transmission gate, operative to selectively couple the output node to the power supply, includes an N-type transistor 301 and a P-type transistor 303. The gate terminal of transistor 301 is coupled to the input node CLKP, while the gate of transistor 303 receives a signal complementary to CLKP. The complementary signal may be produced by inverter 309, which is coupled between the input node CLKP and the gate terminal of transistor 303. The drain and source terminals of transistor 301 are coupled to the power supply and the output node, respectively. The drain and source terminals of transistor 303 are coupled to the output node and the power supply, respectively.

The lower transmission gate is operative to selectively couple the output node to ground, and includes N-type transistor 305 and P-type transistor 307 coupled between the output and ground. The gate of N-type transistor 305 is coupled to input node CLKN, while the gate terminal of P-type transistor 307 receives a signal complementary to CLKN. The complementary signal may be provided by inverter 311, which is coupled between the CLKN input node and the gate of transistor 307. The drain and source terminals of transistor 305 are coupled to the output node and ground, respectively. The drain and source terminals of transistor 307 are coupled to ground and the output node, respectively. The operation of transmission gate DCC circuit 300 is explained below in the context of the timing diagrams of FIGS. 4A and 4B.

Figure 4B:
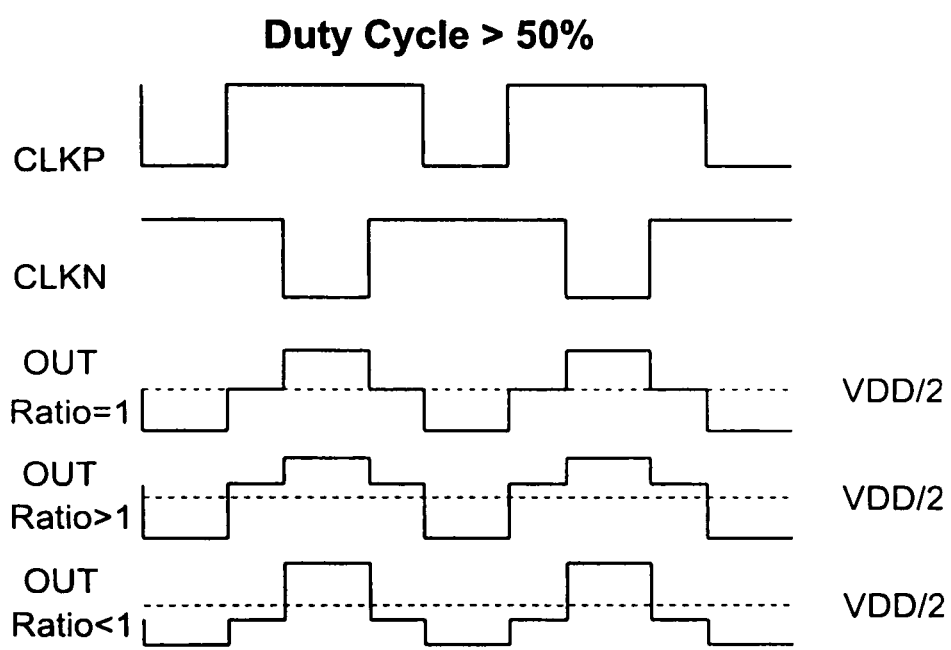

FIGS. 4A and 4B show timing diagrams of a transmission gate DCC circuit such as circuit 300. The timing diagram of FIG. 4A shows the signal produced at the output node OUT in response to an input signal with a duty cycle less than fifty percent (Duty cycle <50%). The timing diagram of FIG. 4B shows the output signal OUT being produced in response to an input signal with a duty cycle greater than fifty percent (Duty cycle >50%).

In both the timing diagram of FIG. 4A and that of FIG. 4B, the output signal OUT takes on the value of the input clock signal CLKP when the CLKP and CLKN signals are complementary. However, when the CLKP and CLKN are not complementary, the state of the output signal varies.

When the input duty cycle is less than 50%, CLKP and CLKN are both in logic LOW states for at least part of each period, as shown in FIG. 4A. When CLKP and CLKN are both in logic LOW states, both the upper and lower transmission gates are turned OFF. Since neither of the transmission gates is in a conducting state, the output lead OUT is uncoupled from both the power supply and ground and is left floating. The output logic states therefore remains in the state it previously was in. The resulting output signal has a 50% duty cycle, as shown in FIG. 4A.

When the input duty cycle is more than 50%, CLKP and CLKN are both in logic HIGH states for at least part of each period, as shown in FIG. 4B. When CLKP and CLKN are both in logic HIGH states, both the upper and lower transmission gates are turned ON. Current flows through the transmission gates from the power supply to ground, setting the output node OUT at an intermediate voltage determined by the ratio of impedances of the transmission gates. If the transmission gates are of the same size (Ratio=1) and have the same output impedance, the voltage at the output lead OUT will be approximately half of the supply voltage. If the upper transmission gate is larger than the lower transmission gate (Ratio>1) and has a lower output impedance, the output voltage will be higher than half the supply voltage. If the upper transmission gate is smaller than the lower transmission gate (Ratio<1) and has a higher output impedance, the output voltage will be lower than half the supply voltage.

As shown in FIG. 4B, the duty cycle of the output signal of the transmission gate DCC circuit is not well defined when the input duty cycle is greater than 50%. During those parts of the cycle in which both CLKP and CLKN input signals are HIGH, the output assumes an intermediate voltage dependent on the size ratio of the transmission gates. If the ratio is greater than one, the duty cycle of the output signal is greater than 50%. Conversely, the output duty cycle is less than 50% if the size ratio is smaller than one. When the size ratio is approximately equal to one, the duty cycle of the output signal may depend on the precise value of the threshold voltage of the clock receiving circuitry, and the precise value of the size ratio. If the threshold voltage is precisely equal to half of the power supply voltage, and the ratio precisely equal to one, the output duty cycle may be 50%. However, if the threshold voltage is slightly lower than half the power-supply voltage or the size ratio slightly greater than one, the duty cycle will be greater than 50%. Conversely, if the threshold voltage is slightly higher than half the power-supply voltage or the size ratio slightly smaller than one, the duty cycle will be less than 50%.

While the transmission gate DCC circuit functions properly with input duty cycles less than 50%, its effectiveness is limited for duty cycles above 50%. When the input duty cycle is greater than 50%, small variations in the ratio of the transmission gate sizes or in the threshold voltage level may cause the DCC circuit to function improperly and to produce output signals with duty cycles not equal to 50%. The effectiveness of the transmission gate DCC circuit is limited by its susceptibility to device mismatching and switching threshold variations.

Figure 5A:
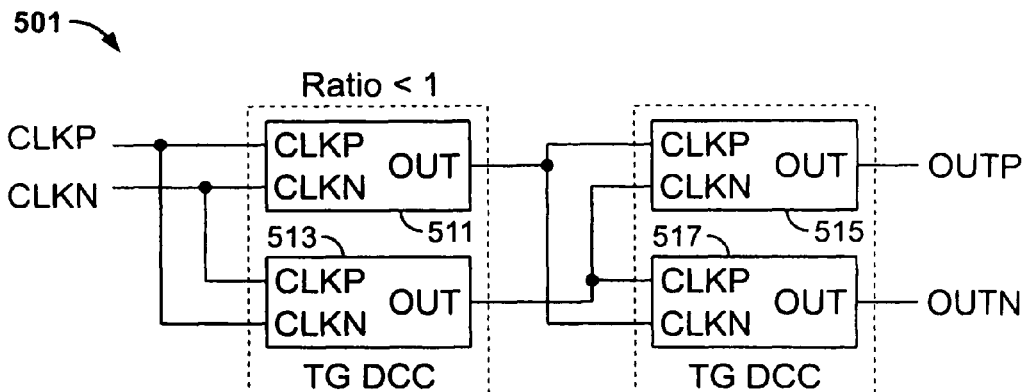
FIGS. 5A-5C show schematic block diagrams of two-stage DCC circuits in accordance with the principles of the invention.
Figure 5B:
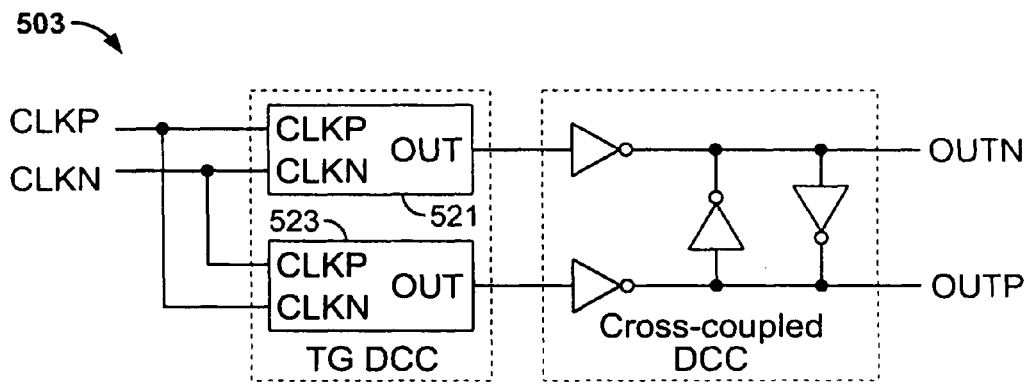
Figure 5C:
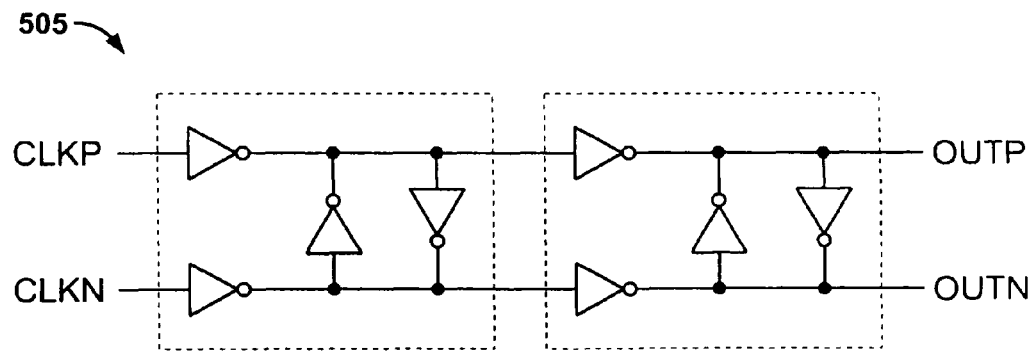

The performance of the duty cycle correction circuits described above may be improved by cascading two or more duty cycle correction circuits in series. FIGS. 5A-5C show three different two-stage cascaded DCC circuits in accordance with the principles of the invention.

The DCC circuit 501 of FIG. 5A includes four transmission gate DCC circuits such as transmission gate (TG) DCC circuit 300. Each of the two stages of circuit 501 includes two transmission gate DCC circuits coupled in parallel and operative to produce a differential output signal. The first stage of circuit 501, which includes DCC circuits 511 and 513, receives differential input signals CLKP and CLKN at its input. The first stage produces a differential output signal which is fed to the second stage. The second stage, which includes DCC circuits 515 and 517, receives the differential output signal of the first stage at its input and produces a differential output signal at output nodes OUTP and OUTN of circuit 501.

In a preferred embodiment, the first stage of DCC circuit 501 is operative to produce a differential output signal with duty cycle less than or equal to 50%. In order to ensure that the duty cycle of the first stage is less than or equal to 50%, the transmission gates of DCC circuits 511 and 513 are selected to have size ratios less than one. As explained in the context of FIGS. 4A and 4B, DCC circuits with transmission gates with size ratios less than one produce output signals with 50% duty cycle if the input duty cycle is less than 50%, and output signals with duty cycles less than 50% if the input duty cycle is greater than 50%. The differential output signal produced by DCC circuits 511 and 513 is fed to the second stage of DCC circuit 501. The second stage DCC circuits 515 and 517, receiving an input signal with duty cycle less than or equal to 50%, are operative to produce an output signal with 50% duty cycle, as shown in FIG. 4A.

While the single-stage transmission DCC circuit 300 of FIG. 3 requires transmission gates with precisely matched size ratios and precise threshold voltage levels for proper operation, the two-stage DCC circuit 501 of FIG. 5 is much less sensitive to device size ratio and threshold voltage levels. In fact, for proper operation, DCC circuit 501 simply requires that the size ratios of the input stage transmission gates be smaller than one.

The circuits of FIGS. 5B and 5C show other exemplary two-stage DCC circuits which provide improved duty cycle correction performance over single-stage DCC circuits. The two-stage DCC circuits are operative to produce duty cycle corrected signals from input signals with wide ranges of duty cycles, such as ranges from 10 to 90% duty cycles. In two-stage DCC circuits 503 and 505, the first stage is operative to bring the duty cycle close to 50% while the second stage further corrects the duty cycle to 50%.

The DCC circuit 503 of FIG. 5B includes a first stage including two transmission gate DCC circuits 521 and 523 operative to produce a differential duty cycle corrected signal at their output nodes. The second stage includes a cross-coupled inverter DCC circuit which receives the differential output signal of the first stage at its inputs, and produces a differential DCC circuit output at output nodes OUTP and OUTN. In a preferred embodiment of DCC circuit 503, the transmission gates of circuits 521 and 523 of the first stage may have size ratios of approximately one. The cross-coupled inverters of the second stage may have a higher driving strength than the second stage input inverters, to ensure improved performance.

The DCC circuit 505 of FIG. 5C includes two cross-coupled inverter DCC circuit stages coupled in series. The two-stage circuit 505 produces a duty cycle corrected differential output signal with minimal requirements on the size ratios of the individual circuit stages. While the cross-coupled inverters in single-stage DCC circuit implementations must have stronger driving strengths than the input inverters to ensure proper functioning of the DCC circuit, this requirement is relaxed in the two-stage implementation. In fact, simulations of two-stage DCC circuits such as circuit 505 have shown good duty cycle correction performance in implementation in which the cross-coupled inverters have driving strengths as low as 0.75 times the driving strength of the input inverters of each stage. These simulations results show that the two-stage cross-coupled inverter DCC circuit greatly reduces the requirements on the driving strength ratio of the inverters forming the circuit, as compared to the single-stage cross-coupled inverter implementation. Note that the minimum value of the ratio in driving strengths ensuring proper functioning of the DCC circuit may change according to the type of technology the circuit is implemented in.

While FIGS. 5A-5C show two-stage embodiments of multi-stage DCC circuits including cross-coupled inverter and transmission gate DCC circuits, it is understood that these embodiments are provided only for purposes of illustration. DCC circuits in accordance with the invention may include additional stages, which may be operative to provide improved DCC performance and to reduce requirements on individual DCC stages. The multi-stage DCC circuits may also include individual DCC circuit stages other than the cross-coupled inverter and transmission gate circuits shown in FIGS. 5A-5C. The stages may be coupled to each other in different orders than those shown in FIGS. 5A-5C. Individual stages may be placed in various locations in the clock path of the circuitry, the stages being concurrent (as shown) or distributed at different points in the clock path.

Figure 6A:
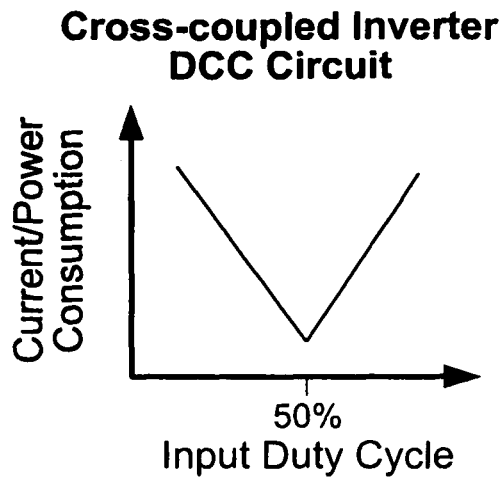
FIGS. 6A-6C show current consumption plots of various DCC circuits.
Figure 6B:
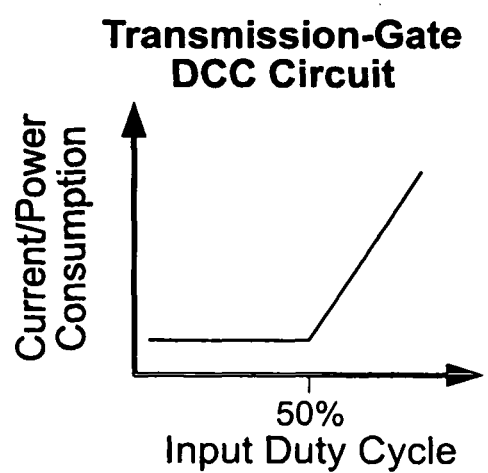

The preceding description of methods and circuits for providing improved duty cycle correction focuses primarily on cross-coupled inverter and transmission gate DCC circuits. While these circuits have the dual advantage of being simple to implement and of requiring relatively few circuit components, the circuits may consume large amounts of power, especially in situations in which the input duty cycle is severely distorted. In both cross-coupled and transmission gate DCC circuits, large short-circuit currents may flow through the circuitry when the differential CLKP and CLKN inputs are not complementary. FIGS. 6A and 6B show general profiles of the circuits' current consumption as a function the input duty cycle.

In cross-coupled inverter DCC circuits such as circuit 100, short-circuit currents flow through the circuit when the CLKP and CLKN input signals are equal. For example, when the input signals are LOW, the input inverters 101 and 103 drive large currents to the output nodes OUTP and OUTN in an attempt to force the output nodes to logic HIGH values. However, as the input inverters attempt to force the output nodes to the same HIGH value, the cross-coupled inverters 105 and 107 work to maintain the output nodes at their previous complementary values. At least one cross-coupled inverter will therefore be operative to sink the current sourced by input inverter 101 or 103 in order to maintain the corresponding output node in its previous logic LOW state. Conversely, when the input signals are HIGH and the input inverters attempt to drive LOW voltages at both output nodes, at least one cross-coupled inverter will be operative to source a large current to maintain the corresponding output node HIGH while the corresponding input inverter attempts to bring it to a LOW value.

As the input duty cycle deviates from 50%, the time during which the CLKP and CLKN input signal are equal during each cycle increases. The current consumption of the circuit therefore also increases, as the time during which the short-circuit currents flow through the circuit increases. The plot of FIG. 6A shows that as the input duty cycle deviates from 50%, the current consumption of the cross-coupled DCC increases.

In transmission gate DCC circuits such as circuit 300, short circuit currents flow through the circuit only when both the CLKP and CLKN inputs are HIGH. As noted previously in the description of FIG. 4B, the CLKP and CLKN inputs are both HIGH during parts of the cycle only when the input duty cycle is greater than 50%. When both inputs are HIGH, the upper and lower transmission gates are turned ON and allow a large current to flow from the power supply through the upper and lower transmission gates to ground. The current is only limited by the series output resistances of the transmission gates, and may therefore be of relatively large amplitude. The plot of FIG. 6B shows that the current consumption of the circuit increases for input duty cycles of more than 50%. Note that when the input duty cycle is less than 50%, the CLKP and CLKN inputs are never HIGH at the same time. As a result, large short-circuit currents do not flow through the circuit and the current consumption of the circuit remains low for input duty cycles below 50%.

Figure 7A:
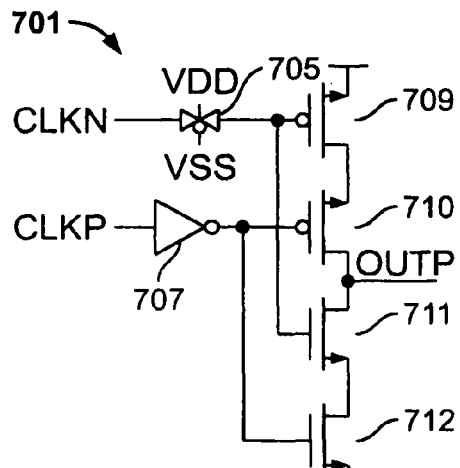
FIGS. 7A and 7B show schematic diagrams of clocked CMOS DCC circuits in accordance with the principles of the invention.
Figure 7B:
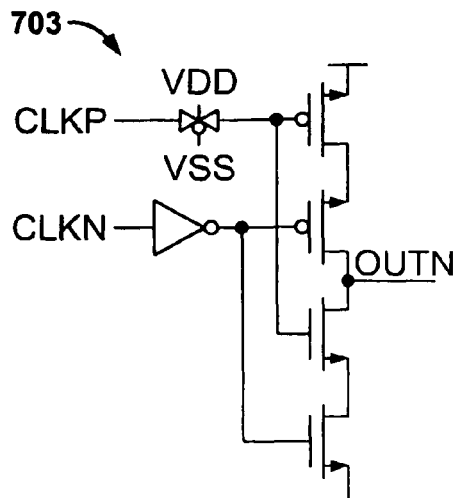

FIGS. 7A and 7B show clocked CMOS DCC circuits 701 and 703. The clocked CMOS DCC circuits 701 and 703 provide efficient means of providing duty cycle correction requiring only four transistors for single-ended output operation. Alternatively, the two circuits 701 and 703 may be used concurrently to produce a differential output signal at nodes OUTP and OUTN.

Each clocked CMOS DCC circuit 701 or 703 includes four transistors coupled in series between the power supply and ground. In circuits 701 and 703, a first PMOS transistor 709 has its source terminal coupled to the power supply and its drain terminal coupled to the source of second PMOS transistor 710. Second PMOS transistor 710 further has its drain coupled to the output node OUTP and to the drain of first NMOS transistor 711. First NMOS transistor 711 has its source coupled to the drain of second NMOS transistor 712, and transistor 712 has its source terminal coupled to ground. The transistors are controlled by the input signals CLKP and CLKN, their gate terminals being coupled to one of the input nodes through an inverter or a transmission gate. In circuit 701, input signal CLKP is fed into inverter 707, the output of inverter 707 being coupled to the gate terminals of transistors 710 and 712. Input signal CLKN is fed through transmission gate 705 to the gate terminals of transistors 709 and 711. Transmission gate 705 is hard-wired in a conducting state, and is used to produce approximately equal transmission delays in the signal paths from the inputs CLKP and CLKN to the output OUTP.

Circuit 703 of FIG. 7B shows a clocked CMOS DCC circuit complementary to circuit 701. In circuit 703, the CLKP input controls transistors 709 and 711 through transmission gate 705, while the CLKN input controls transistors 710 and 712 through inverter 707. Circuit 703 operates in a manner similar to circuit 701 to produce a duty cycle corrected output signal OUTN. The output signal OUTN is complementary to the output signal OUTP produced by circuit 701 when the same input signals CLKP and CLKN are applied to both circuits. Circuits 701 and 703 can be used in concert to provide a differential duty cycle corrected output signal at nodes OUTP and OUTN from input signals CLKP and CLKN.

Figures 8A, 8B:
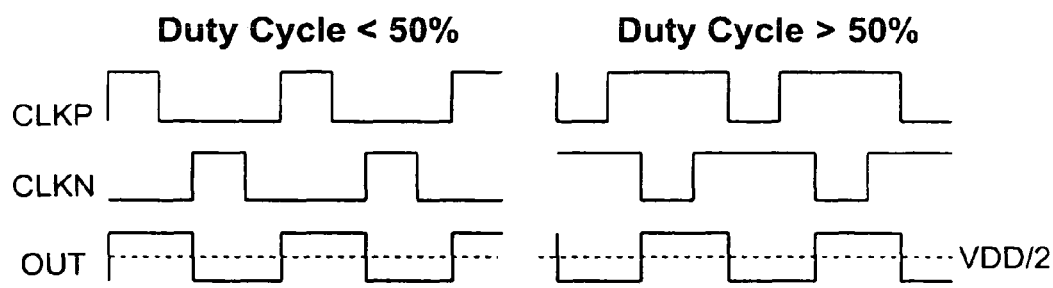
FIGS. 8A and 8B show timing diagrams of clocked CMOS DCC circuits in accordance with the principles of the invention.

Output timing diagrams of clocked CMOS DCC circuit 701 are shown in FIGS. 8A and 8B. The timing diagrams show exemplary output waveforms produced in response to input signals with duty cycles below 50% (FIG. 8A) and greater than 50% (FIG. 8B). The operation and output of circuit 701 is similar regardless of the input duty cycle. In both FIGS. 8A and 8B, when CLKP is HIGH and CLKN is LOW, transistors 709 and 710 are turned on while transistors 711 and 712 are turned OFF. The output node OUTP is therefore coupled to the power supply, and the output is in a logic HIGH state. Conversely, when CLKP is LOW and CLKN is HIGH, transistors 711 and 712 are turned ON while transistors 709 and 710 are turned OFF. The output node OUTP is coupled to ground, and the output voltage is in a LOW state. When the input signals are not complementary and CLKP and CLKN are equal, the output node is left floating and remains in its previous state. If both CLKP and CLKN are HIGH, for example, transistors 710 and 711 are ON while transistors 709 and 712 are OFF. The output node is therefore neither coupled to the power supply nor ground and is left floating. Similarly, if both CLKP and CLKN are LOW, transistors 709 and 712 are ON while transistors 710 and 711 are OFF. The output node is again left floating, and remains in its previous state.

Figure 6C:
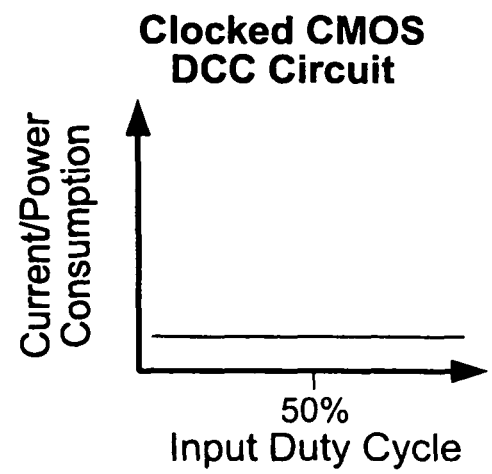

As shown in the timing diagrams FIGS. 8A and 8B, the clocked CMOS DCC circuit produces an output signal with a 50% duty cycle both when the input signal duty cycle is greater than or below 50%. In this way, the clocked CMOS DCC circuit provides high quality duty cycle correction for wide ranges of input duty cycles. In addition, the clocked CMOS DCC circuit has low power consumption because no short-circuit currents flow through the circuitry at any point during the cycle. FIG. 6C shows that for all values of input duty cycle, the circuit consumes a minimum amount of current.

Note that the clocked CMOS DCC circuits of FIGS. 7A and 7B may be implemented in various circuit technologies, including integrated circuits using MOS technology (as shown), integrated circuits using other transistor technologies, programmable logic devices, and other types of circuitry.

Figure 9:
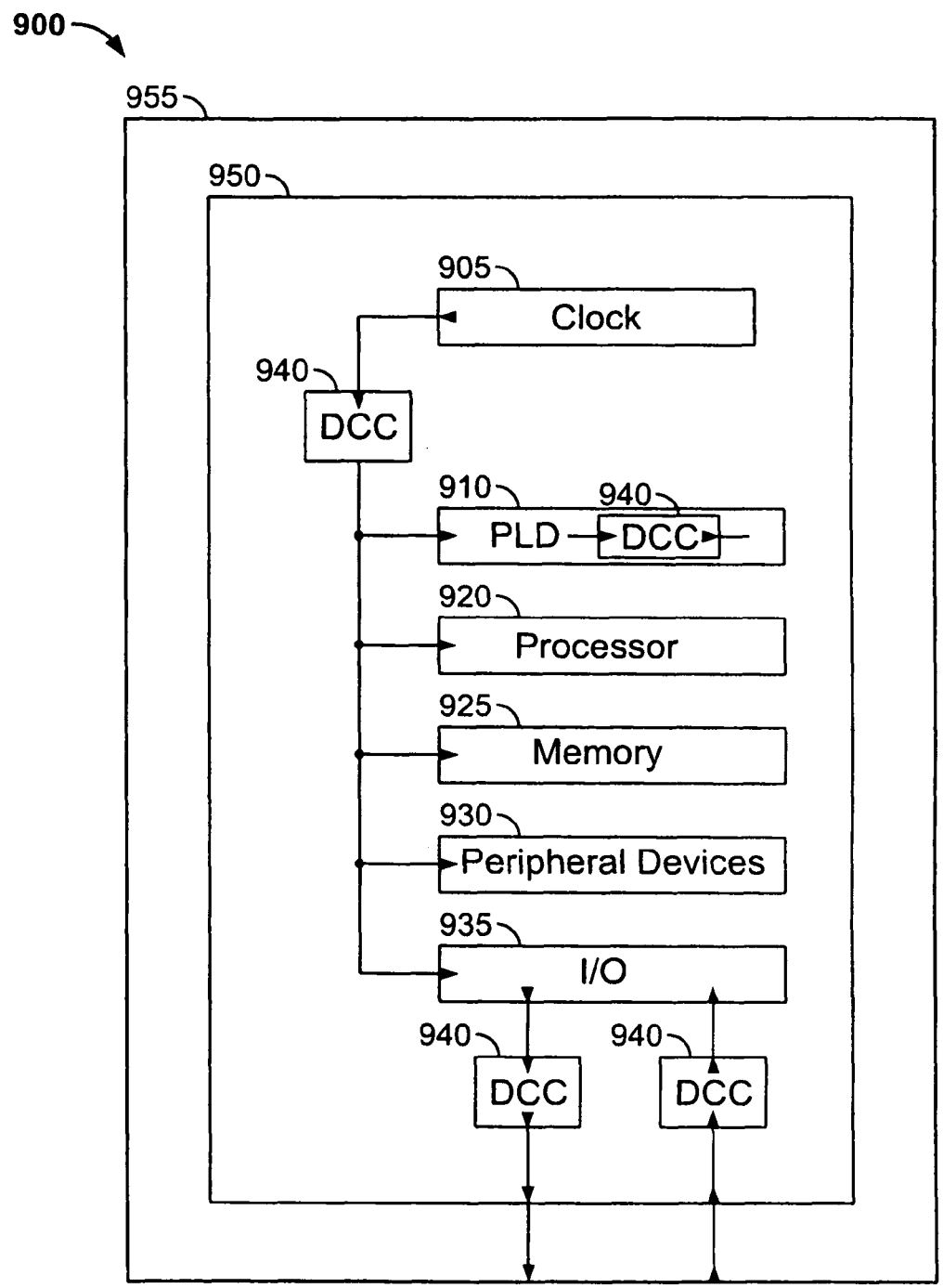
FIG. 9 shows an illustrative system including a DCC circuit in accordance with the principles of the invention.

FIG. 9 shows an illustrative system employing duty cycle correction circuitry in accordance with the principles of the invention. System 900 may be a digital processing system, a digital integrated circuit, or any other circuitry which may include duty cycle correction circuitry such as DCC circuitry 940. System 900 may include one or more of a clock 905, programmable logic device 910, processor 920, memory 925, peripheral devices 930, and system level I/O circuitry 935. DCC circuitry 940 in accordance with the principles of the invention may be used to correct the duty cycle of clock signals at various locations within the circuitry 950 of system 900. DCC circuitry 940 may include multi-stage DCC circuitry such as circuits 501, 503 or 505, clocked CMOS circuitry such as circuit 701 or 703, or other circuitry in accordance with the principles of the invention. DCC circuitry 940 may be located in clock paths between various components of system 900, as well as in clock paths within individual components of the system such as within programmable logic device 910. DCC circuitry may also be used in paths of clocks received as inputs to system 900, in clock paths of clocks sent as outputs of system 900, or in clock paths of clocks generated on system 900. The components of system 900 may be contained in an end-user system 955.

System 900 can be used in a wide variety of applications, such as computer networking, data networking, instrumentation, video processing, digital signal processing, or any other application in which both edges of the clock signal are used for timing. Note that system 900 is only exemplary and in no way should be construed to limit the true scope and spirit of the invention. The duty cycle correction circuitry of the invention may be used in integrated circuits and devices other than digital processing systems, as well as in other types of circuitry such as circuitry mounted on a circuit board.

It will be understood that the foregoing is only illustrative of the principles of the invention, and that various modifications can be made by those skilled in the art without departing from the scope and spirit of the invention. The particular circuit implementations shown herein are presented for purposes of illustration and not of limitation, and other constructions and embodiments can be used instead if desired.

The invention claimed is:

1. Duty cycle correction circuitry operative to receive an input signal at one or more input nodes and to produce an output signal at one or more output nodes, the circuitry comprising:
   first and second switches coupled in series between a power supply and a first output node of the circuitry;
   third and fourth switches coupled in series between the first output node of the circuitry and ground, wherein:
   the first and third switches are selectively controlled by a first input signal;
   the second and fourth switches are selectively controlled by a second input signal complementary to the first input signal;
   the first input signal is received at a first input node of the circuitry;
   the second input signal is received at a second input node of the circuitry;
   gate terminals of the second and fourth switches are coupled to the second input node through an inverter; and
   the input signals and the output signal are clock signals.

2. The circuitry defined in claim 1, wherein gate terminals of the first and third switches are coupled to the first input node through one or more delay elements.

3. The circuitry defined in claim 2, wherein the delay elements comprise a transmission gate that is turned on.

4. The circuitry defined in claim 1, wherein the first and second switches are P-type devices and the third and fourth switches are N-type devices.

5. The circuitry defined in claim 4, wherein:
   the first switch has a source terminal coupled to the power supply and a drain terminal coupled to a source terminal of the second switch;
   the second switch further has a drain terminal coupled to the first output node of the circuitry;
   the third switch has a drain terminal coupled to the first output node of the circuitry and a source terminal coupled to a drain terminal of the fourth switch; and the fourth switch further has a source terminal coupled to ground.

6. The circuitry defined in claim 5, wherein the first and third switches have gate terminals coupled to each other and to a first input node of the circuitry, the first input node configured to receive the first input signal, and wherein the second and fourth switches have gate terminals coupled to each other and to a second input node of the circuitry, the second input node configured to receive the second input signal.

7. The circuitry defined in claim 6, wherein the gate terminals of the second and fourth switches are coupled to the second input node through an inverter.

8. An integrated circuit comprising the circuitry defined in claim 1.

9. A programmable logic device comprising the circuitry defined in claim 1.

10. Duty cycle correction circuitry, the circuitry comprising:
  first and second input nodes and an output node;
  first and second switches coupled in series between a power supply and the output node; and
  third and fourth switches coupled in series between the output node and ground; wherein:
  the first and third switches are selectively controlled by a first input signal;
  the second and fourth switches are selectively controlled by a second input signal complementary to the first input signal; and
  gate terminals of the second and fourth switches are coupled to the second input node through an inverter.

11. Duty cycle correction circuitry operative to receive an input signal at one or more input nodes and to produce an output signal at one or more output nodes, the circuitry comprising:
  first and second switches coupled in series between a power supply and a first output node of the circuitry; and
  third and fourth switches coupled in series between the first output node of the circuitry and ground; wherein:
  the first and third switches are selectively controlled by a first input signal;
  the second and fourth switches are selectively controlled by a second input signal complementary to the first input signal; and
  gate terminals of the second and fourth switches are coupled to an input node of the circuitry through an inverter.

* * * * *